United States Patent
Shiragami

(10) Patent No.: US 12,246,525 B2
(45) Date of Patent: Mar. 11, 2025

(54) METHOD FOR PRODUCING BONDED BODY

(71) Applicant: Nippon Electric Glass Co., Ltd., Shiga (JP)

(72) Inventor: Toru Shiragami, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 135 days.

(21) Appl. No.: 18/020,755

(22) PCT Filed: Sep. 24, 2021

(86) PCT No.: PCT/JP2021/035041
§ 371 (c)(1),
(2) Date: Feb. 10, 2023

(87) PCT Pub. No.: WO2022/071107
PCT Pub. Date: Apr. 7, 2022

(65) Prior Publication Data
US 2023/0302780 A1    Sep. 28, 2023

(30) Foreign Application Priority Data
Sep. 29, 2020   (JP) ................. 2020-163630

(51) Int. Cl.
*B32B 37/12*   (2006.01)
*B32B 17/06*   (2006.01)
*B32B 37/10*   (2006.01)

(52) U.S. Cl.
CPC .......... *B32B 37/1207* (2013.01); *B32B 17/06* (2013.01); *B32B 37/10* (2013.01); *B32B 2037/1238* (2013.01); *B32B 2250/02* (2013.01); *B32B 2255/20* (2013.01); *B32B 2310/0843* (2013.01); *B32B 2313/00* (2013.01); *B32B 2315/08* (2013.01); *B32B 2457/20* (2013.01)

(58) Field of Classification Search
None
See application file for complete search history.

(56) References Cited

U.S. PATENT DOCUMENTS

2012/0205032 A1   8/2012   Matsumoto
2020/0047285 A1   2/2020   Yang et al.

FOREIGN PATENT DOCUMENTS

| JP | 2011-246320 | 12/2011 |
|----|-------------|---------|
| JP | 2012-096930 | 5/2012 |
| JP | 2012-169068 | 9/2012 |

(Continued)

OTHER PUBLICATIONS

Machine English translation of JP-2012226978-A, Accessed Aug. 19, 2024 (Year: 2012).*

(Continued)

*Primary Examiner* — Jacob T Minskey
*Assistant Examiner* — Adrianna N Konves
(74) *Attorney, Agent, or Firm* — Wenderoth, Lind & Ponack, L.L.P.

(57) ABSTRACT

A bonding step in a method of producing a bonded body includes a first bonding step of forming a sealing layer (4) by irradiating a sealing material (6) belonging to an inner group (IG) with a laser beam (L), and a second bonding step of forming a sealing layer (4) by irradiating a sealing material (6) belonging to an outer group (OG) with the laser beam (L) after the first bonding step.

6 Claims, 11 Drawing Sheets

(56) References Cited

FOREIGN PATENT DOCUMENTS

| JP | 2012-226978 | 11/2012 |
| JP | 2015-216322 | 12/2015 |
| JP | 2018-199600 | 12/2018 |
| JP | 2020-040863 | 3/2020 |

OTHER PUBLICATIONS

International Preliminary Report on Patentability and Written Opinion of the International Searching Authority issued Mar. 28, 2023, in International (PCT) Application No. PCT/JP2021/035041, with English translation.

Notice of Reasons for Refusal issued Apr. 12, 2024 in corresponding Japanese Patent Application No. 2020-163630, with English language translation.

International Search Report issued Dec. 7, 2021, in International (PCT) Application No. PCT/JP2021/035041, with English translation.

\* cited by examiner

METHOD FOR PRODUCING BONDED BODY

TECHNICAL FIELD

The present invention relates to a method of producing a bonded body by bonding substrates.

BACKGROUND ART

As is well known, electronic devices such as LED devices are housed in hermetically sealed packages to prevent deterioration. The hermetically sealed package is formed as a bonded body in which, for example, a second substrate (glass substrate) is bonded to a first substrate (base).

For example, Patent Document 1 discloses a method of producing a hermetically sealed package by bonding containers and glass lids, in which multiple containers serving as first substrates and multiple glass lids serving as second substrates are prepared, glass frits serving as sealing materials are arranged between each container and each glass lid, and the glass frits are irradiated with a laser beam to form sealing layers.

In this method, first, the containers and the glass lids are stacked and held by a first jig and a second jig. The second jig includes plungers that press the containers against the glass lids. While the containers are pressed against the glass lids by the plungers of the second jig, the glass frits between the containers and the glass lids are irradiated with a laser beam to produce the hermetically sealed package that hermetically seals the containers and the glass lids.

CITATION LIST

Patent Literature

Patent Document 1: JP 2018-199600 A

SUMMARY OF INVENTION

Technical Problem

In the method of producing described above, multiple laminates formed by stacking multiple containers and multiple glass lids are held by the first jig and the second jig, and each of the laminates is bonded individually. A possible method for efficient mass production of such hermetically sealed packages is, for example, to prepare a first substrate from which a large number of containers can be cut and a second substrate from which a large number of glass lids can be cut, bond the first substrate and the second substrate, and then cut the bonded body of the first substrate and the second substrate into individual hermetically sealed packages.

With this method, a large number of sealing materials are present between the first substrate and the second substrate, and each of these sealing materials is sequentially irradiated with a laser beam. In FIG. 12, there is illustrated an example of heating sealing materials 6 arranged in a predetermined array pattern in a laminate LM in the order indicated by the arrow B.

The laminate LM includes the sealing materials 6 arranged in nine rows (M1 to M9) and nine columns (N1 to N9). In this example, heating using a laser beam is started from the outermost sealing material 6 of the sealing materials 6. That is, in FIG. 12, after the sealing material 6 in the first row M1 and the first column N1 is heated, the other sealing materials 6 in the first row M1 are sequentially heated from the second column N2 to the ninth column N9. Subsequently, the sealing materials 6 in the second row M2 are heated in order from the sealing material 6 located on the outermost side (first column N1). The sealing materials 6 in the third row M3 to the ninth row M9 are also heated in the same manner. The bonded body is completed once all the sealing materials 6 are heated.

The sealing material shrinks when heated with a laser beam. The inventor found that, when producing a bonded body as described above, shrinkage of the sealing materials during heating causes a difference between the distance between the first substrate and the second substrate at already bonded portions and the distance between the first substrate and the second substrate at portions not yet bonded, resulting in misalignment between the sealing materials and the substrates. The inventor found that when this misalignment becomes greater, defects occur in portions bonded by the sealing material.

The present invention has been made in view of the above circumstances, and a technical object of the invention is to reduce the occurrence of defects in a bonded portion of a bonded body.

Solution to Problem

The present invention is to solve the above problems. A method of producing a bonded body including a first substrate, a second substrate, and multiple sealing layers bonding the first substrate and the second substrate, the method comprising: a lamination step of forming a laminate by interposing multiple sealing materials between the first substrate and the second substrate and stacking the first substrate and the second substrate, and a bonding step of forming the multiple sealing layers by irradiating the multiple sealing materials in the laminate with a laser beam, wherein the multiple sealing materials in the laminate are interposed between the first substrate and the second substrate in a predetermined array pattern, wherein the array pattern comprises: an outer group including the sealing materials located on the outermost sides among the multiple sealing materials and an inner group including at least one sealing material located inward of the sealing materials belonging to the outer group, and wherein the bonding step comprises: a first bonding step of forming at least one sealing layer by irradiating the at least one sealing material belonging to the inner group with the laser beam, and a second bonding step of forming the sealing layers by irradiating the sealing materials belonging to the outer group with the laser beam after the first bonding step.

According to the method, irradiating the at least one sealing material belonging to the inner group with the laser beam in the first bonding step before irradiating the sealing materials belonging to the outer group can reduce misalignment of each of the substrates due to shrinkage of the sealing materials when the first bonding step is performed. Further, in the second bonding step after the first bonding step, the sealing materials belonging to the outer group can be heated without being affected by the shrinkage of the at least one sealing layer formed in the inner group. Thus, the occurrence of bonding defects can be reduced in both the at least one sealing layer belonging to the inner group and the sealing layers belonging to the outer group.

In the method, in the first bonding step, when the at least one sealing material includes multiple sealing materials, of the multiple sealing materials belonging to the inner group, the sealing material located closest to the center of the array pattern is preferably irradiated first with the laser beam.

With this configuration, by starting the first bonding step (laser beam irradiation) from the sealing material closest to the center of the array pattern, the occurrence of misalignment of each of the substrates can be suitably reduced even when other sealing materials are subsequently heated.

In the method, in the array pattern, the multiple sealing materials may be arranged in three or more rows and three or more columns.

In the method, the second substrate may be a glass substrate.

In the bonding step in the method, the laminate may be supported by a support device that presses the first substrate and the second substrate. Thus, the sealing materials can be brought into contact with the first substrate and the second substrate, and the occurrence of bonding defects in the sealing layers can be more effectively reduced.

Further, the support device may comprises a pressing member that presses the first substrate against the second substrate, and a support plate disposed between the first substrate and the pressing member.

With such a configuration, the support device can press the first substrate by the pressing member and the support plate with an even force. Thus, the occurrence of bonding defects in the sealing layers due to misalignment of the first substrate and the second substrate can be more effectively reduced.

Advantageous Effects of Invention

According to the present invention, the occurrence of defects in a bonded portion of a bonded body can be reduced.

DESCRIPTION OF EMBODIMENTS

Hereinafter, embodiments for implementing the present invention will be described with reference to the drawings. In FIGS. 1 to 11, there is illustrated an embodiment of a method of producing a bonded body according to the present invention.

Figure 1:
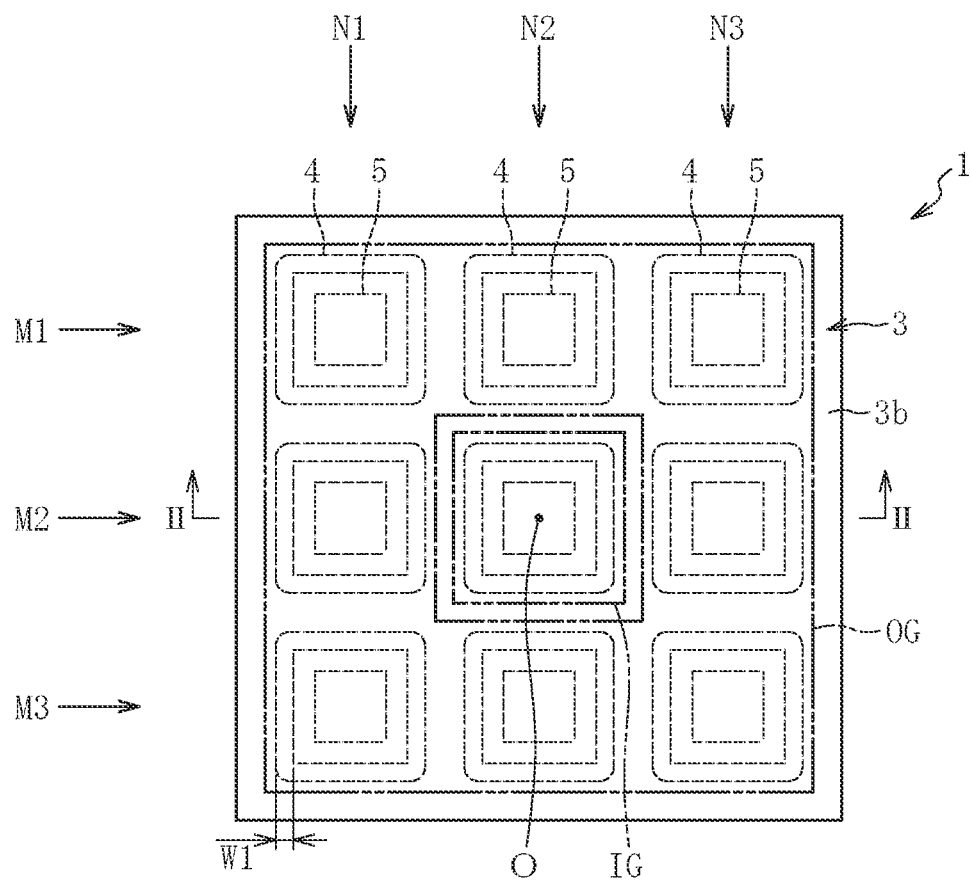
FIG. 1 is a plan view of a bonded body.
Figure 2:
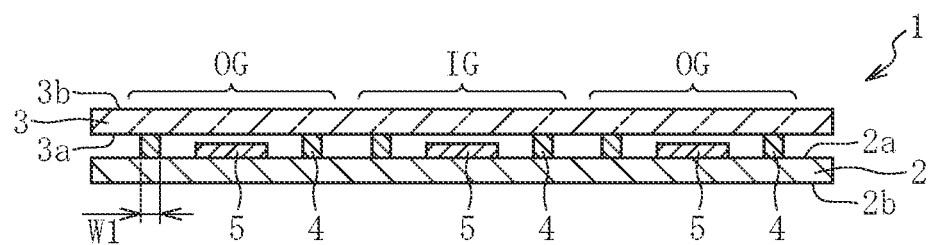
FIG. 2 is a cross-sectional view taken along line II-II in FIG. 1.

In FIGS. 1 and 2, there is illustrated a hermetically sealed package as an example of a bonded body produced according to the present invention. A bonded body 1 includes a first substrate 2 as a base, a second substrate 3 that is overlaid on the first substrate 2, multiple sealing layers 4 that bond the first substrate 2 and the second substrate 3, and elements 5 that are housed between the first substrate 2 and the second substrate 3.

The first substrate 2 is formed in a rectangular shape, but is not limited to this shape. Other possible shapes for the first substrate 2 include polygons and circles. The first substrate 2 has a first main surface 2a on which the elements 5 are mounted, and a second main surface 2b located on the opposite side of the first main surface 2a. The first main surface 2a may include recessed portions capable of housing the elements 5.

The first substrate 2 is a high-thermal-conductivity substrate such as a silicon substrate, but is not limited thereto, and may be any of various substrates such as other metal substrates, ceramic substrates, and semiconductor substrates. Note that the thickness of the first substrate 2 is within a range from 0.1 to 5.0 mm, but is not limited to this range.

The thermal conductivity of the first substrate 2 may be higher than the thermal conductivity of the second substrate 3. The thermal conductivity of the first substrate 2 at 20° C. is preferably from 10 to 500 W/m·K, more preferably from 30 to 300 W/m·K, still more preferably from 70 to 250 W/m·K, in particular preferably from 100 to 200 W/m·K, but is not limited to this range.

The second substrate 3 is configured of, for example, a transparent glass substrate with a rectangular shape, but is not limited to this shape. Other possible shapes for the second substrate 3 include polygons and circles. The second substrate 3 has a first main surface 3a and a second main surface 3b located on the opposite side of the first main surface 3a.

Examples of the glass configuring the material of the second substrate 3 include alkali-free glass, borosilicate glass, soda-lime glass, quartz glass, and crystallized glass having a low coefficient of thermal expansion. The thickness of the second substrate 3 is not particularly limited and is, for example, within a range from 0.01 to 2.0 mm. The thermal conductivity of the second substrate 3 at 20° C. is preferably from 0.5 to 5 W/m·K, but is not limited to this range.

The multiple sealing layers 4 are formed in the bonded body 1 in a predetermined array pattern. In the present embodiment, the bonded body 1 in which a total of nine sealing layers 4 are formed in an array pattern of three rows and three columns is described as an example, but the number and array pattern of the sealing layers 4 are not limited to the present embodiment. In FIG. 1, row numbers M1 to M3 and column numbers N1 to N3 are assigned to the sealing layers 4 in the array pattern (matrix arrangement).

As illustrated in FIG. 1, of the multiple sealing layers 4, the array pattern of the sealing layers 4 is divided into an outer group OG including the outermost sealing layers 4 and an inner group IG including the sealing layers 4 located inward of the sealing layers 4 belonging to the outer group OG.

The sealing layers 4 are formed by irradiating multiple sealing materials present between the first substrate 2 and the second substrate 3 with a laser beam to heat the sealing materials, thereby softening and fluidizing the sealing materials.

Various materials can be used as the sealing material. From the perspective of increasing sealing strength, a composite material (glass frit) containing bismuth-based glass powder and refractory filler powder is preferably used. Since the coefficient of thermal expansion of bismuth-based glass is typically large, when mixed with the refractory filler powder, the coefficient of thermal expansion of the sealing layer 4 is likely to match the coefficients of thermal expansion of the first substrate 2 and the second substrate 3. As a result, after bonding the first substrate 2 and the second substrate 3 together, undesirable stress is less likely to remain in the sealing layer 4 regions.

When the content of the refractory filler powder in the composite material is too low, as described above, the coefficient of thermal expansion of the sealing layer 4 is less likely to match the coefficients of thermal expansion of the first substrate 2 and the second substrate 3. In addition, the viscosity of the glass frit is significantly lowered during bonding, resulting in a difference between the distance between the already bonded first substrate and second substrate and the distance between the first substrate and second substrate that have not yet been bonded. This causes misalignment between the sealing material and the substrates. On the other hand, when the content of the refractory filler powder in the composite material is too high, the content of the bismuth-based glass powder is relatively low. Thus, the surface smoothness of the sealing material before laser sealing deteriorates, and bonding accuracy tends to decrease. Therefore, a composite material containing from 55 to 100 volume % of bismuth-based glass powder and from 0 to 45 volume % of refractory filler powder is preferable, a composite material containing from 60 to 99 volume % of bismuth-based glass powder and from 1 to 40 volume % of refractory filler powder is more preferable, a composite material containing from 60 to 95 volume % of bismuth-based glass powder and from 5 to 40 volume % of refractory filler powder is still more preferable, and a composite material containing from 60 to 85 volume % of bismuth-based glass powder and from 15 to 40 volume % of refractory filler powder is particularly preferable.

The bismuth-based glass preferably contains from 28 to 60% of $Bi_2O_3$, from 15 to 37% of $B_2O_3$, from 0 to 30% of ZnO, and from 1 to 40% of CuO+MnO (total amount of CuO and MnO) as the glass composition, in mol %. The reason for limiting the content ranges of individual components as described above will be explained below. Note that in description of the glass composition range, % refers to mol %.

$Bi_2O_3$ is a main component for lowering the softening point of glass, and is also a component that adjusts the viscosity of the glass when the glass is softened and fluidized after irradiating the composite material with a laser beam. The content of $Bi_2O_3$ is preferably from 28 to 60%, from 33 to 55%, in particular from 35 to 45%. When the content of $Bi_2O_3$ is too low, the softening point is too high, and the softening and fluidization properties of the glass tend to decrease. On the other hand, when the content of $Bi_2O_3$ is too high, the viscosity of the glass is significantly lowered during bonding, resulting in a difference between the distance between the already bonded first substrate and second substrate and the distance between the first substrate and the second substrate that have not yet been bonded. This causes misalignment between the sealing material and the substrates. In addition, the glass tends to devitrify during bonding, and this devitrification leads to a decrease in the softening and fluidization properties of the glass.

$B_2O_3$ is an essential glass-forming component. The content of $B_2O_3$ is preferably from 15 to 37%, from 19 to 33%, in particular from 22 to 30%. When the content of $B_2O_3$ is too low, the glass network is difficult to form and the glass tends to devitrify. In addition, the viscosity of the glass decreases during bonding, resulting in a difference between the distance between the already bonded first substrate and second substrate and the distance between the first substrate and second substrate that have not yet been bonded. This causes misalignment between the sealing material and the substrates. On the other hand, when the content of $B_2O_3$ is too high, the viscosity of the glass increases, and the softening and fluidization properties of the glass tends to decrease.

ZnO is a component that increases the devitrification resistance of glass. The content of ZnO is preferably from 0 to 30%, from 3 to 25%, from 5 to 22%, in particular from 5 to 20%. When the content of ZnO is too high, the balance of the glass composition is lost, and the devitrification resistance is rather lowered.

CuO and MnO are components that significantly increase the laser absorption capacity of glass. The total amount of CuO and MnO is preferably from 1 to 40%, from 3 to 35%, from 10 to 30%, in particular from 15 to 30%. When the total amount of CuO and MnO is too small, the laser absorption capacity tends to decrease. On the other hand, when the total amount of CuO and MnO is too large, the softening point is too high, and the softening and fluidization properties of the glass tend to decrease even after being irradiated with a laser beam. In addition, the glass tends to be thermally unstable and devitrify. Note that the content of CuO is preferably from 1 to 30%, in particular from 10 to 25%. The content of MnO is preferably from 0 to 25%, from 1 to 25%, in particular from 3 to 15%.

Apart from glass powder of bismuth-based glass, glass powder of silver phosphate-based glass, tellurium-based glass, or the like can also be used as the sealing material. Compared to bismuth-based glass, silver phosphate-based glass and tellurium-based glass tend to soften and fluidize at a lower temperature, thereby reducing thermal strain that occurs after heating with a laser beam. Further, similar to bismuth-based glass, mixing silver phosphate-based glass and tellurium-based glass with a refractory filler powder can increase the mechanical strength of the sealing layer 4 and decrease the coefficient of thermal expansion of the sealing layer 4.

Silver phosphate-based glass preferably contains from 10 to 50% of $Ag_2O$, from 10 to 35% of $P_2O_5$, from 3 to 25% of ZnO, and from 0 to 30% of transition metal oxides, as glass composition, in mol %.

Tellurium-based glass preferably contains from 30 to 80% of $TeO_2$, from 5 to 50% of $MoO_3$, from 0 to 15% of $P_2O_5$, and from 0 to 40% of transition metal oxides (excluding $MoO_3$), as glass composition, in mol %.

Various materials can be used as the refractory filler powder. One or more materials selected from cordierite, zircon, tin oxide, niobium oxide, zirconium phosphate-based ceramic, willemite, β-eucryptite, and β-quartz solid solution are preferably used.

A median particle size $D_{50}$ of the refractory filler powder is preferably less than 2 μm, in particular greater than or equal to 0.1 μm and less than 1.5 μm. When the median particle size $D_{50}$ of the refractory filler powder is too large, the surface smoothness of the sealing layer 4 tends to deteriorate and the average thickness of the sealing layer 4 tends to increase. As a result, bonding accuracy tends to decrease. In this embodiment, the median particle size $D_{50}$ is a value measured by a laser diffraction method, and refers to a particle size at which the accumulated amount is 50% cumulatively from the smallest particle in a volume-based cumulative particle size distribution curve measured by the laser diffraction method.

A 99% particle size $D_{99}$ of the refractory filler powder is preferably less than 5 µm, 4 µm or lower, in particular 0.3 µm or higher and 3 µm or lower. When the 99% particle size $D_{99}$ of the refractory filler powder is too large, the surface smoothness of the sealing layer 4 tends to deteriorate and the average thickness of the sealing layer 4 tends to increase. As a result, laser bonding accuracy tends to decrease. In this embodiment, the 99% particle size $D_{99}$ is a value measured by a laser diffraction method, and refers to a particle size at which the accumulated amount is 99% cumulatively from the smallest particle in the volume-based cumulative particle size distribution curve measured by the laser diffraction method.

The softening point of the sealing material is preferably 300° C. or higher and 550° C. or lower. The softening point of the sealing material corresponds to the fourth inflection point when measured with a macro-type DTA device.

As illustrated in FIG. 1, the sealing layer 4 is arranged in a closed curve shape forming a space for housing the elements 5 by bonding. In the present invention, the term "closed curve" means not only shapes composed of only curved lines but also shapes composed of a combination of curved lines and straight lines, and shapes composed only of straight lines (e.g., polygons such as quadrilaterals).

The thickness of the sealing layer 4 is preferably from 1 µm to 20 µm, more preferably from 3 to 8 µm. A width dimension W1 of the sealing layer 4 is preferably from 50 to 2000 µm, more preferably from 100 to 1000 µm.

The elements 5 are mounted on the first main surface 2a of the first substrate 2. The element 5 is disposed in a space (cavity) defined by the first main surface 2a of the first substrate 2, the first main surface 3a of the second substrate 3, and the sealing layer 4. As the element 5, any type of element such as a light emitting element such as a deep-ultraviolet light-emitting diode (LED), a micro electro mechanical systems (MEMS) element, and a charge coupled device (CCD) element can be used.

A method of producing the bonded body 1 having the configuration described above will be described below with reference to FIGS. 3 to 6. The method includes a preparation step of forming a laminate by stacking the first substrate 2 and the second substrate 3, and a bonding step of bonding the first substrate 2 and the second substrate 3 by heating sealing materials in the laminate after the preparation step.

In the preparation step, multiple sealing materials for forming the multiple sealing layers 4 are formed on the first main surface 3a of the second substrate 3 according to an array pattern including the outer group OG and the inner group IG, corresponding to the array pattern of the sealing layers 4.

Figure 3:
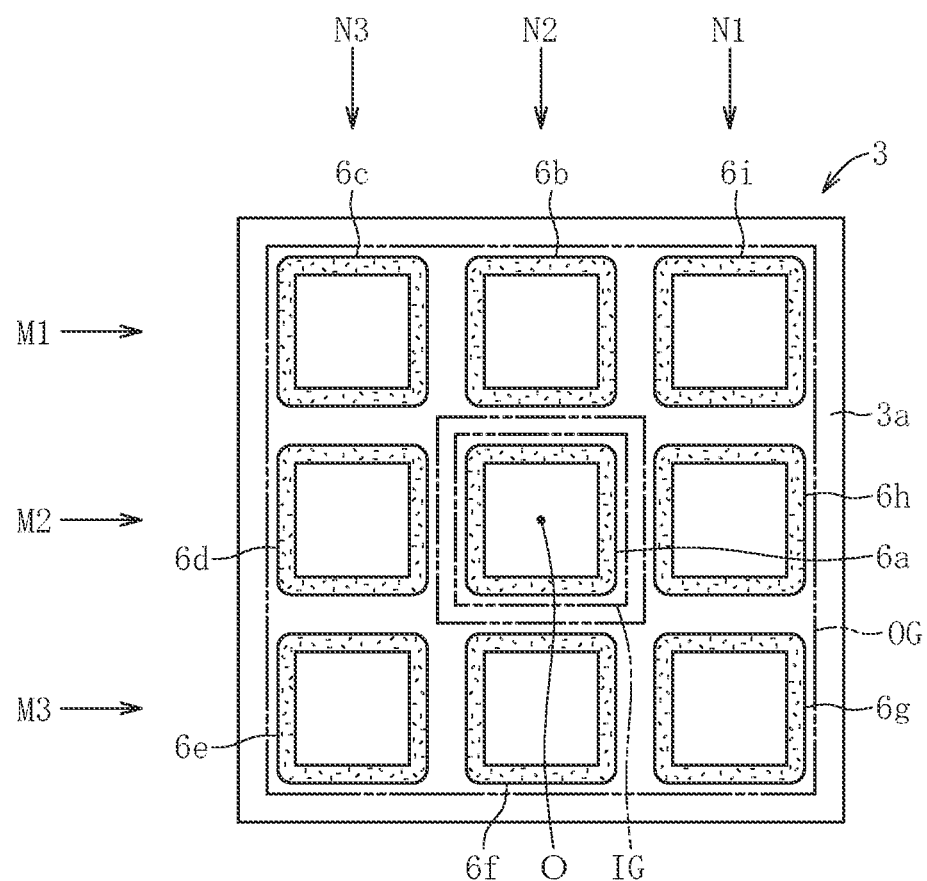
FIG. 3 is a bottom view of a second substrate.

In FIG. 3, the row numbers M1 to M3 and the column numbers N1 to N3 are assigned to nine sealing materials 6a to 6i formed on the second substrate 3 in the array pattern. In the following description, the position of a particular sealing material 6 (6a to 6i) may be described with reference to these row numbers and column numbers.

The preparation step includes a fixing step of fixing the sealing materials 6a to 6i to the first main surface 3a of the second substrate 3, and a lamination step of forming the laminate by stacking the first substrate 2 and the second substrate 3 after the fixing step.

The fixing step includes a step of applying the sealing material to the first main surface 3a of the second substrate 3 (application step), and a step of heating the sealing material (heating step) after the application step.

In the application step, for example, a paste sealing material is applied to the first main surface 3a of the second substrate 3 by screen printing or dispensing to form a closed curve with a quadrilateral shape. The sealing material is typically made into a paste by kneading the composite material described above and a vehicle with a three-roller or similar device. The vehicle usually contains an organic resin and a solvent. The organic resin is added to adjust the viscosity of the paste.

In the heating step, the sealing material applied to the second substrate 3 is heated to the softening temperature or higher using an electric furnace or the like. In the heating step, the organic resin is decomposed and the glass powder contained in the sealing material softens and fluidizes. As a result, the sealing material adheres to the first main surface 3a of the second substrate 3. In the heating step, the sealing material may be heated (fired) by a laser beam without using the electric furnace or the like. Thus, as illustrated in FIG. 3, the nine sealing materials 6a to 6i are fixed to the first main surface 3a of the second substrate 3.

Figure 4:
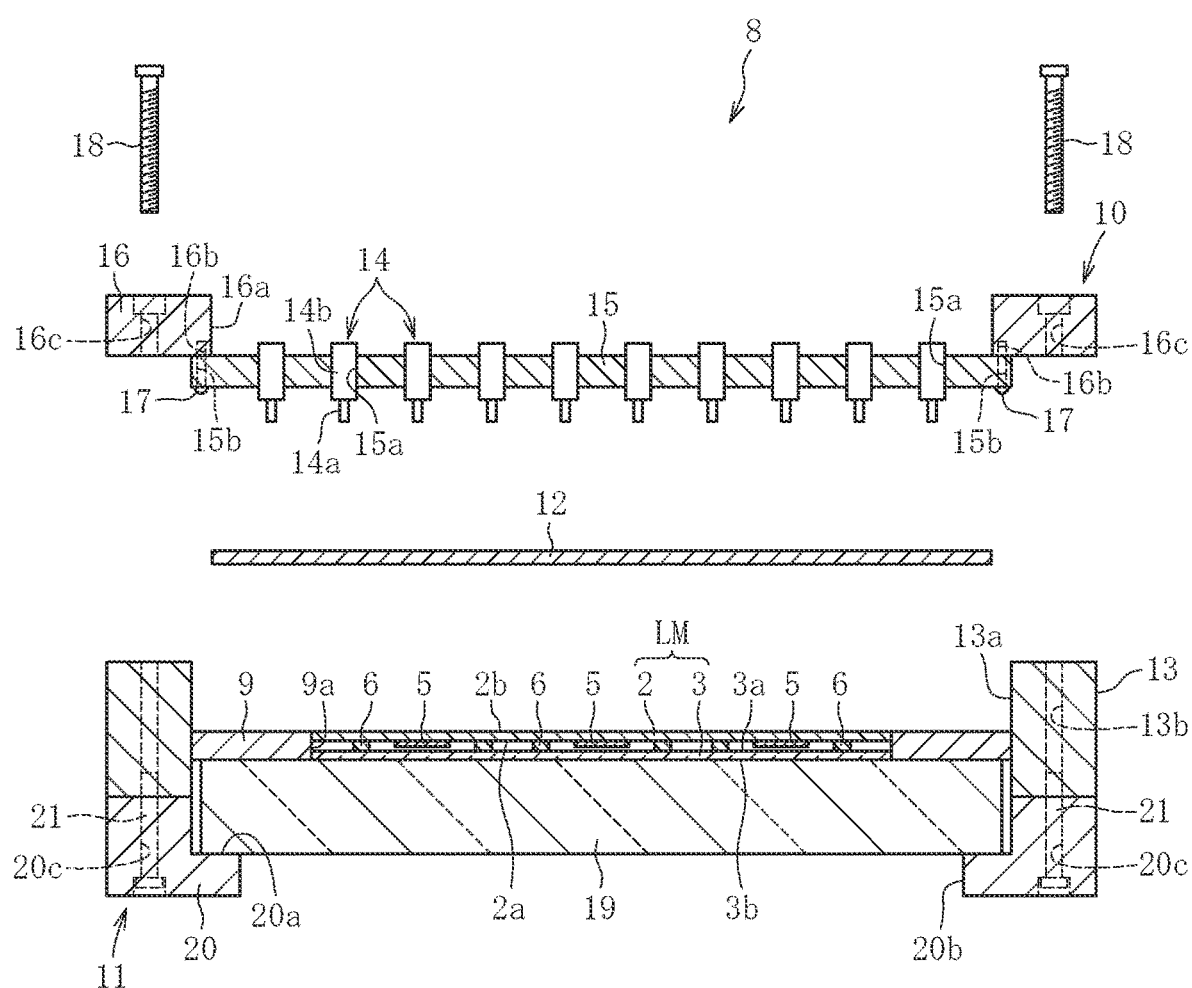
FIG. 4 is a cross-sectional view for illustrating one step of a method of producing the bonded body.

In the lamination step, a support device 8 illustrated in FIG. 4 is used for stacking the first substrate 2 and the second substrate 3 to form a laminate LM.

The support device 8 mainly includes a frame body 9 that holds the first substrate 2 and the second substrate 3, a first support 10 that supports the first substrate 2, a second support 11 that supports the second substrate 3, a support plate 12 interposed between the first support 10 and the first substrate 2, and an intermediate member 13 interposed between the first support 10 and the second support 11.

The frame body 9 is a rectangular plate member having a predetermined thickness, but is not limited to this shape. The frame body 9 has an opening 9a in which the first substrate 2 and the second substrate 3 can be housed.

The first support 10 includes pressing members 14 that press the first substrate 2 via the support plate 12, a holding plate 15 that holds the pressing members 14, and support members (hereinafter, referred to as "first support member") 16 that support the holding plate 15.

The pressing members 14 are configured of, for example, multiple plungers, but are not limited to this configuration. Each plunger includes a spring member, but is not limited to this configuration. Each pressing member 14 may be, for example, a pneumatic plunger. Each pressing member 14 includes a rod portion 14a that is biased by a spring member, and a body portion 14b that supports the rod portion 14a and the spring member.

The holding plate 15 has holding holes 15a for holding the body portions 14b of the pressing members 14, and a hole 15b through which a fixing member 17 such as a screw member is inserted. The first support member 16 has an opening 16a, a screw hole 16b through which the fixing member 17 is inserted, and a hole 16c through which a fixing member 18 is inserted for fixing the intermediate member 13 to the first support member 16. The holding plate 15 is fixed to the first support member 16 by aligning the hole 15b with the screw hole 16b of the first support member 16 and inserting the fixing member 17 into these holes 15b and 16b.

The support plate 12 is interposed between the first substrate 2 and the rod portion 14a of the pressing member 14, and supports the first substrate 2. The support plate 12 preferably has an area larger than the second main surface 2b of the first substrate 2 so as to be in contact with the second main surface 2b. The support plate 12 is a metal plate made of stainless steel or the like, but the material of the support plate 12 is not limited to the material of the present embodiment.

The second support 11 includes a support substrate 19 that supports the second substrate 3 and the frame body 9, and a support member (hereinafter referred to as "second support member") 20 that supports the support substrate 19.

The support substrate 19 is configured of, for example, a transparent glass substrate so that a laser beam can pass therethrough in the bonding step. The second support member 20 has a recess 20a for housing the support substrate 19, an opening 20b that allows a laser beam to pass therethrough, and a hole 20c through which the fixing member 21 is inserted.

The intermediate member 13 is a rectangular plate member having a predetermined thickness, but is not limited to this shape. The intermediate member 13 has an opening 13a in which the support substrate 19 of the second support 11 and the frame body 9 can be housed, and a screw hole 13b that engages with the fixing members 18 and 21. The opening 13a extends through the intermediate member 13 in a thickness direction of the intermediate member 13. The screw hole 13b extends through the intermediate member 13 in the thickness direction of the intermediate member 13.

As illustrated in FIG. 4, in the lamination step, first, the first substrate 2 and the second substrate 3 are stacked so that the first main surface 2a of the first substrate 2 and the first main surface 3a of the second substrate 3 face each other. Note that the elements 5 are already disposed on the first main surface 2a of the first substrate 2.

Subsequently, the first substrate 2 and the second substrate 3 are inserted into the opening 9a of the frame body 9. Thus, the frame body 9 holds the first substrate 2 and the second substrate 3. Note that the intermediate member 13 is fixed to the second support member 20 of the second support 11 by the fixing member 21.

Subsequently, the frame body 9 is inserted into the recess 20a of the second support member 20 of the second support 11. Thus, the frame body 9 and the second substrate 3 are supported by the support substrate 19. Subsequently, the support plate 12 is inserted into the recess 20a of the second support member 20. Thus, the support plate 12 comes into contact with the second main surface 2b of the first substrate 2 held by the frame body 9.

Subsequently, the first support 10 is overlaid on the second support 11 and inserted into the hole 16c of the first support member 16 and the screw hole 13b of the intermediate member 13 by way of the fixing member 18, thereby connecting the first support 10 and the intermediate member 13.

At this time, the rod portion 14a of the pressing member 14 comes into contact with the support plate 12. Thus, the support plate 12 is pressed by the rod portion 14a. The support plate 12 presses the second main surface 2b of the first substrate 2 with the pressing force of the pressing member 14, thereby pressing the first substrate 2 against the second substrate 3.

In this manner, in the lamination step, the first support 10 and the second support 11 of the support device 8 sandwich the laminate LM formed by stacking the first substrate 2 and the second substrate 3. Moreover, the support device 8 supports the laminate LM with the sealing materials 6a to 6i between the first substrate 2 and the second substrate 3 in close contact with the first substrate 2 and the second substrate 3 by the pressing force of the pressing member 14.

Figure 5:
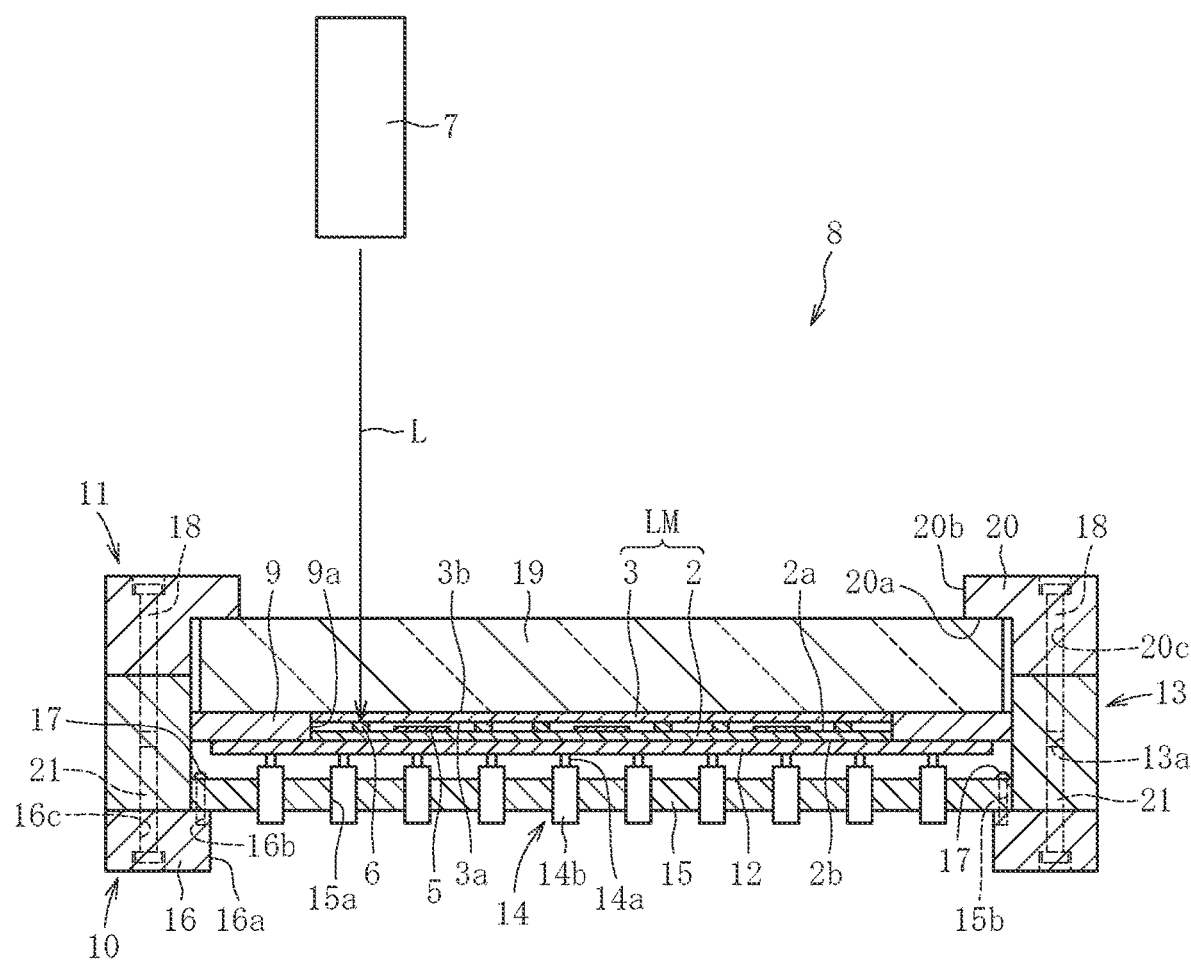
FIG. 5 is a cross-sectional view for illustrating one step of the method of producing the bonded body.

As illustrated in FIG. 5, in the bonding step, the sealing materials 6a to 6i of the laminate LM are irradiated with a laser beam L from a laser irradiation device 7 to be heated (heating step). The laser beam L passes through the support substrate 19 of the second support 11 and the second substrate 3 to irradiate the sealing materials 6a to 6i. In the bonding step, the sealing materials 6a to 6i are heated by irradiation with the laser beam L to a temperature equal to or greater than the softening point of the sealing materials 6a to 6i or a temperature at which the sealing materials 6a to 6i soften and fluidize.

The wavelength of the laser beam L is preferably from 600 to 1600 nm. A semiconductor laser may be suitably used as the laser, but the laser is not limited thereto. Any laser such as a YAG laser, a green laser, and an ultrashort pulse laser may be used.

The bonding step includes a first bonding step in which the sealing material 6a belonging to the inner group IG is irradiated with the laser beam L to form the sealing layer 4, and a second bonding step in which the sealing materials 6b to 6i belonging to the outer group OG are irradiated with the laser beam L after the first bonding step to form the sealing layers.

In the first bonding step, in the inner group IG in the array pattern, the sealing material 6a located at a position overlapping a center O (position of the second row M2 and the second column N2) is irradiated with the laser beam L. As indicated by the arrow A in FIG. 6, the laser beam L is scanned so as to circulate along a circumferential direction of the closed curve shape formed by the sealing material 6a. The number of circulations of the laser beam L in this case is preferably from 2 to 500.

After being heated by the laser beam L in the first bonding step, the glass component of the sealing material 6a is softened and fluidized, and adheres to the first substrate 2. During cooling after the irradiation with the laser beam L is complete, the sealing material 6a adheres to form the sealing layer 4 with the closed curve shape that bonds the first substrate 2 and the second substrate 3 and hermetically seals the elements 5.

Figure 6:
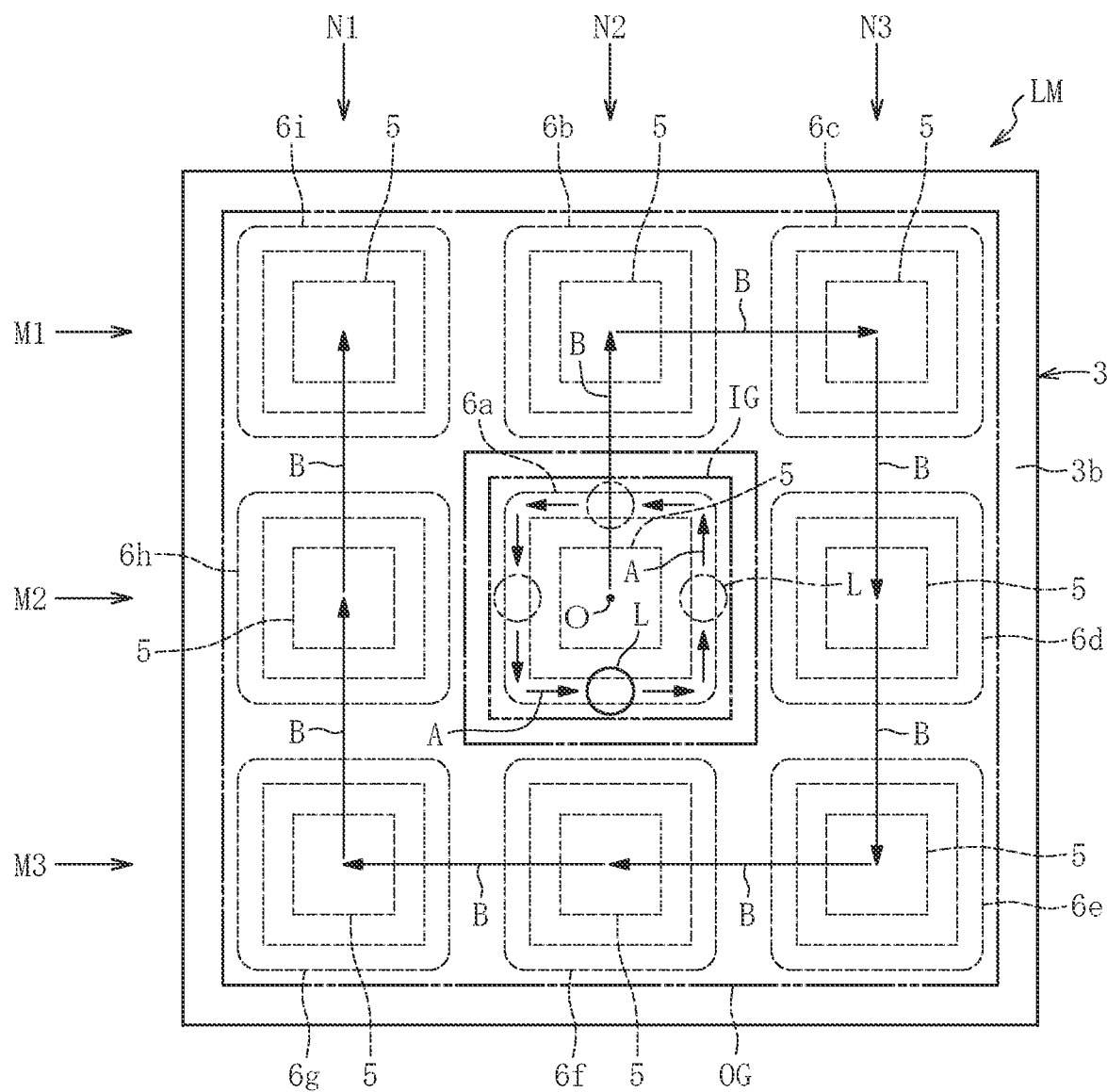
FIG. 6 is a plan view for illustrating one step of the method of producing the bonded body.

Once the sealing layer 4 is formed from the sealing material 6a, the second bonding step is performed in the order indicated by the arrow B in FIG. 6.

That is, in the second bonding step, in the outer group OG in the array pattern, the sealing material 6b at a position adjacent to (nearest to) the sealing material 6a belonging to the inner group IG (position of the first row M1 and the second column N2) is irradiated with the laser beam L. When the heating of the sealing material 6b is complete, the sealing material 6c at a position adjacent to the sealing material 6b (position of the first row M1 and the third column N3) is irradiated with the laser beam L. Subsequently, the remaining sealing materials 6d to 6i are sequentially irradiated with the laser beam L. The second bonding step is completed when all the sealing materials 6b to 6i belonging to the outer group OG are heated to form the sealing layers 4. In this way, the bonded body 1 having the multiple sealing layers 4 is produced.

In FIGS. 7 to 10, there are illustrated other examples of bonding steps. In the example illustrated in FIG. 6, the laminate LM in which the nine sealing materials 6a to 6i are arranged in three rows and three columns is illustrated, but the number of sealing materials 6 may be greater than in this example.

Figure 7:
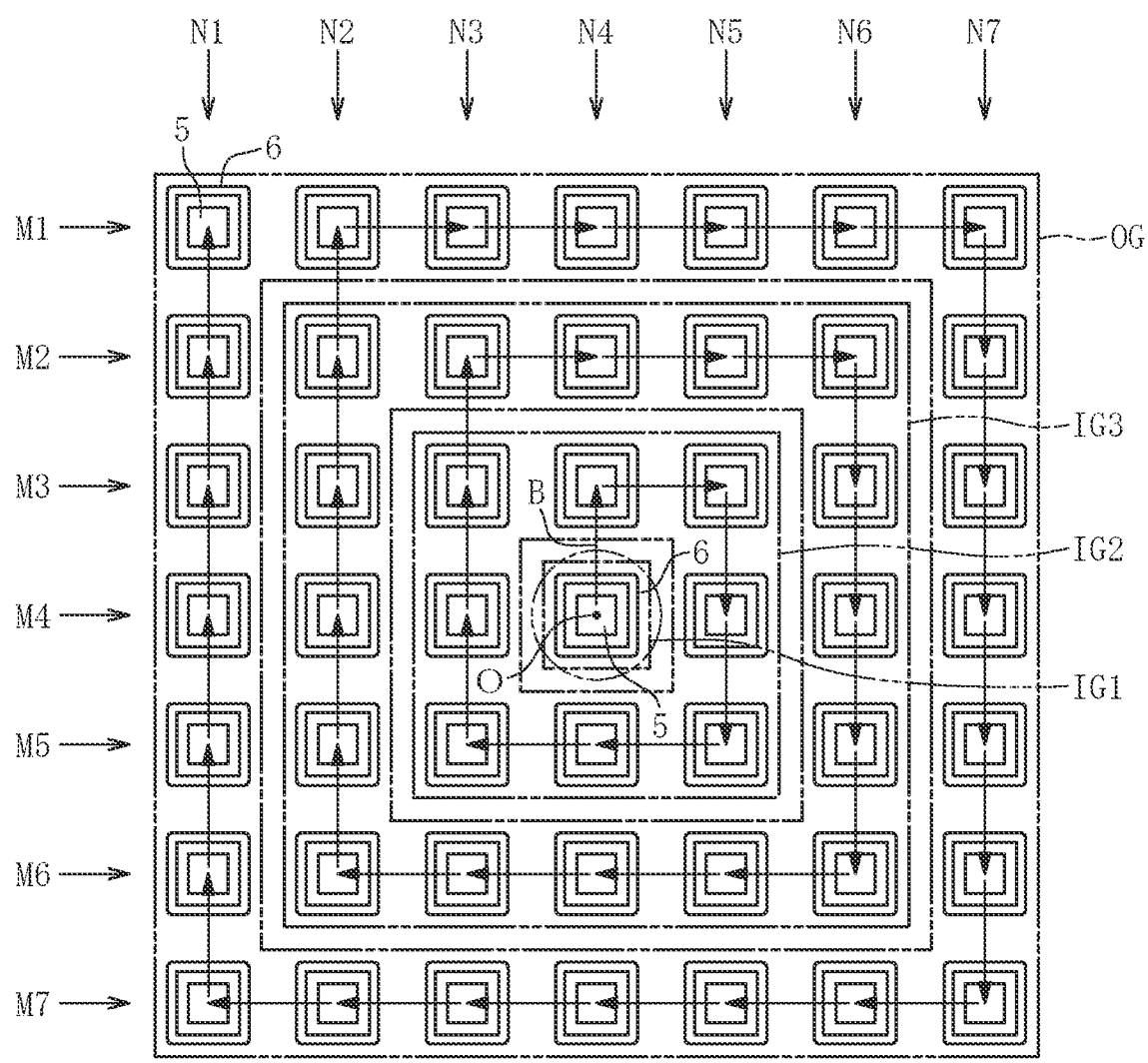
FIG. 7 is a plan view for illustrating another example of a method of producing a bonded body.

In FIG. 7, there is illustrated an array pattern of a total of 49 sealing materials 6 arranged in seven rows (M1 to M7) and seven columns (N1 to N7). In this case, 24 sealing materials 6 belong to an outer group OG and 25 sealing materials 6 belong to any of inner groups IG1 to IG3. In this example, the inner groups IG1 to IG3 include the first inner group IG1 including the sealing material 6a disposed overlapping a center O of the array pattern, the second inner group IG2 set outward so as to surround the first inner group IG1, and the third inner group IG3 set outward so as to surround the second inner group IG2.

When producing the bonded body 1 in this example, in the first bonding step, one sealing material 6a in the first inner group IG1 at a position overlapping the center O of the array pattern (position of the fourth row M4 and the fourth column N4) is first irradiated with the laser beam L. When the heating of the sealing material 6a is complete, the sealing material 6 belonging to the second inner group IG2 and located at a position adjacent to the sealing material 6a of the first inner group IG1 (position of the third row M3 and the fourth column N4) is irradiated with the laser beam L. Subsequently, the sealing material 6 at a position adjacent to this sealing material 6 (position of the third row M3 and the fifth column N5) is irradiated with the laser beam L. Subsequently, the remaining sealing materials 6 belonging to the second inner group IG2 are sequentially irradiated with the laser beam L.

When the heating of the sealing materials 6 belonging to the second inner group IG2 is complete, the sealing materials 6 belonging to the third inner group IG3 are heated. In this case, the sealing material 6 to be heated first in the third inner group IG3 (the sealing material located in the second row M2 and the third column N3) is located at a position adjacent to the sealing material 6 heated last in the second inner group IG2 (the sealing material located in the third row M3 and the third column N3).

When the heating of the sealing materials 6 belonging to the third inner group IG3 is complete, the second bonding step is performed. In this case, the sealing material 6 to be heated first in the second bonding step (the sealing material located in the first row M1 and the second column N2) is located at a position adjacent to the sealing material 6 heated last in the third inner group IG3 (the sealing material located in the second row M2 and the second column N2). The sealing materials 6 belonging to the outer group OG are sequentially heated, and the second bonding step is completed when the heating of all the sealing materials 6 is complete.

Figure 8:
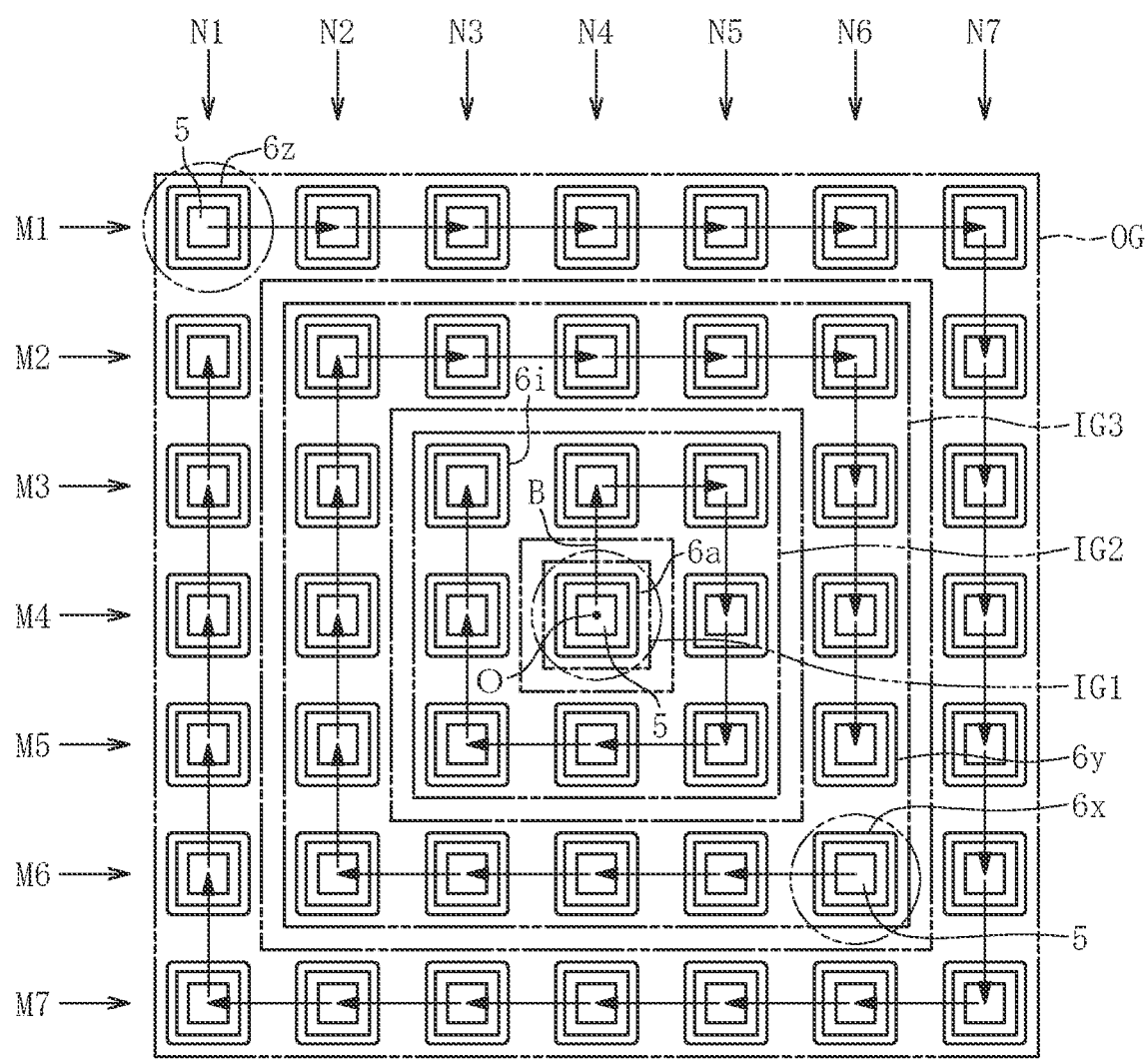
FIG. 8 is a plan view for illustrating another example of a method of producing a bonded body.

In the example illustrated in FIG. 8, in the first bonding step, one sealing material 6a (sealing material belonging to the first inner group IG1) at a position overlapping the center O of the array pattern (the fourth row M4 and the fourth column N4) is first irradiated with the laser beam L. Then, eight sealing materials 6 (sealing materials belonging to the second inner group IG2) disposed outward so as to surround the sealing material 6a are sequentially heated with the laser beam L.

Subsequently, 16 sealing materials 6 (sealing materials belonging to the third inner group IG3) disposed outward so as to surround the 8 sealing materials 6 are sequentially heated with the laser beam L.

In this case, a sealing material 6x to be heated first in the third inner group IG3 (sealing material at a position of the sixth row M6 and the sixth column N6) is not adjacent to and is separated from the sealing material 6i heated last in the second inner group IG2 (sealing material at a position of the third row M3 and the third column N3). This reduces the occurrence of a difference in the distance between the first substrate 2 and the second substrate 3.

Also, a sealing material 6y to be heated last in the third inner group IG3 (sealing material at a position of the fifth row M5 and the sixth column N6) is not adjacent to and is separated from a sealing material 6z to be heated first in the outer group OG (sealing material at a position of the first row M1 and the first column N1) when the second bonding step is performed. This reduces the occurrence of a difference in the distance between the first substrate 2 and the second substrate 3.

Figure 9:
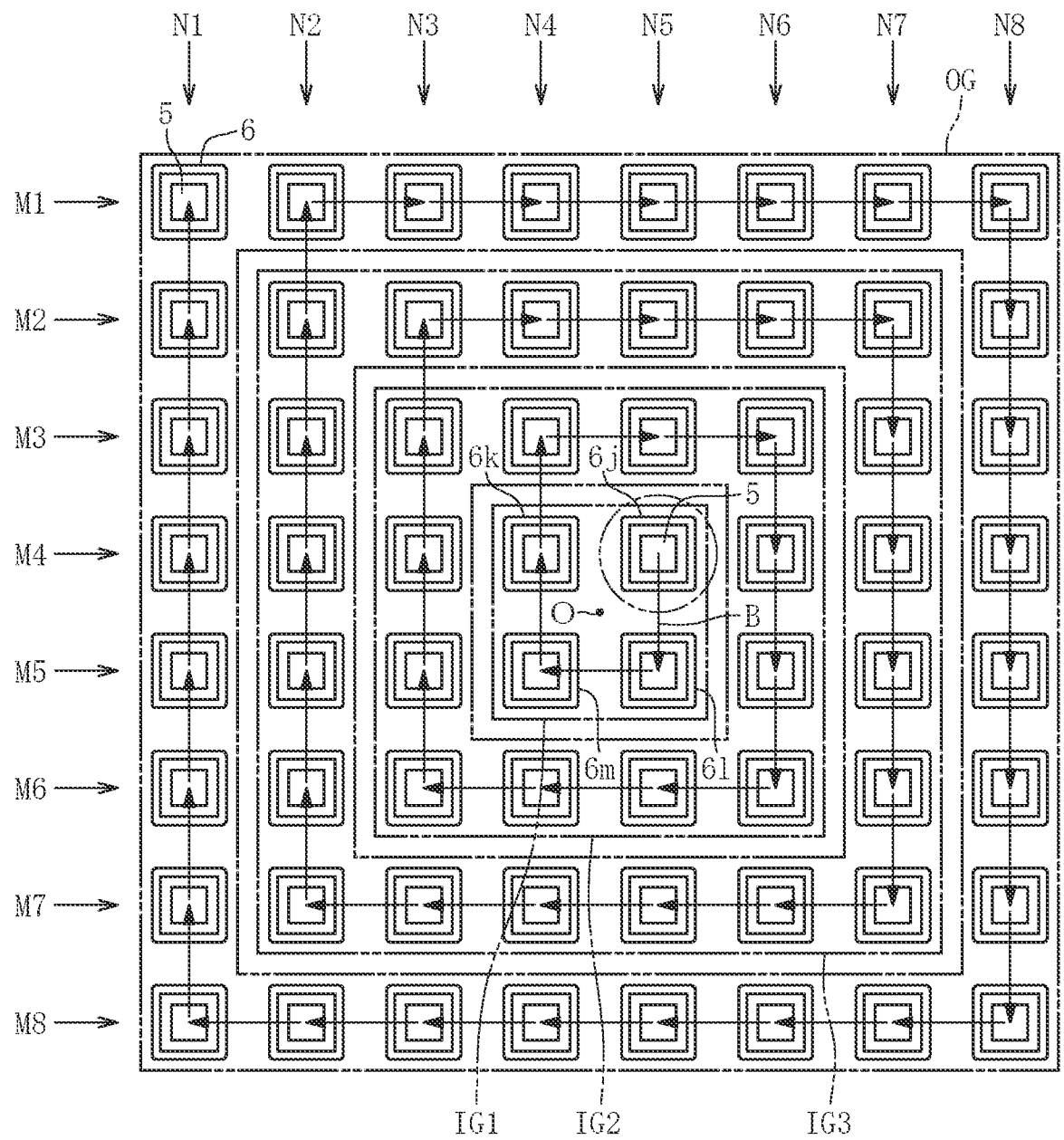
FIG. 9 is a plan view for illustrating another example of a method of producing a bonded body.

The array pattern illustrated in FIG. 9 has eight rows (M1 to M8) and eight columns (N1 to N8), and a total of 64 sealing materials 6 are arranged. In the example of FIG. 7 described above, the array pattern includes one sealing material 6a overlapping the center O of the array pattern. The array pattern for this example includes four sealing materials 6j to 6m at positions closest to the center O of the array pattern.

The array pattern includes a first inner group IG1 including the four sealing materials 6j to 6m, a second inner group IG2 including 12 sealing materials 6 disposed outward so as to surround the first inner group IG1, a third inner group IG3 including 20 sealing materials 6 disposed outward so as to surround the second inner group IG2, and an outer group OG including 28 sealing materials 6.

When there are multiple sealing materials 6j to 6m at positions closest to the center O of the array pattern as in this example, the sealing material 6j being one of the sealing materials 6j to 6m may be first irradiated with the laser beam L in the first bonding step.

Figure 10:
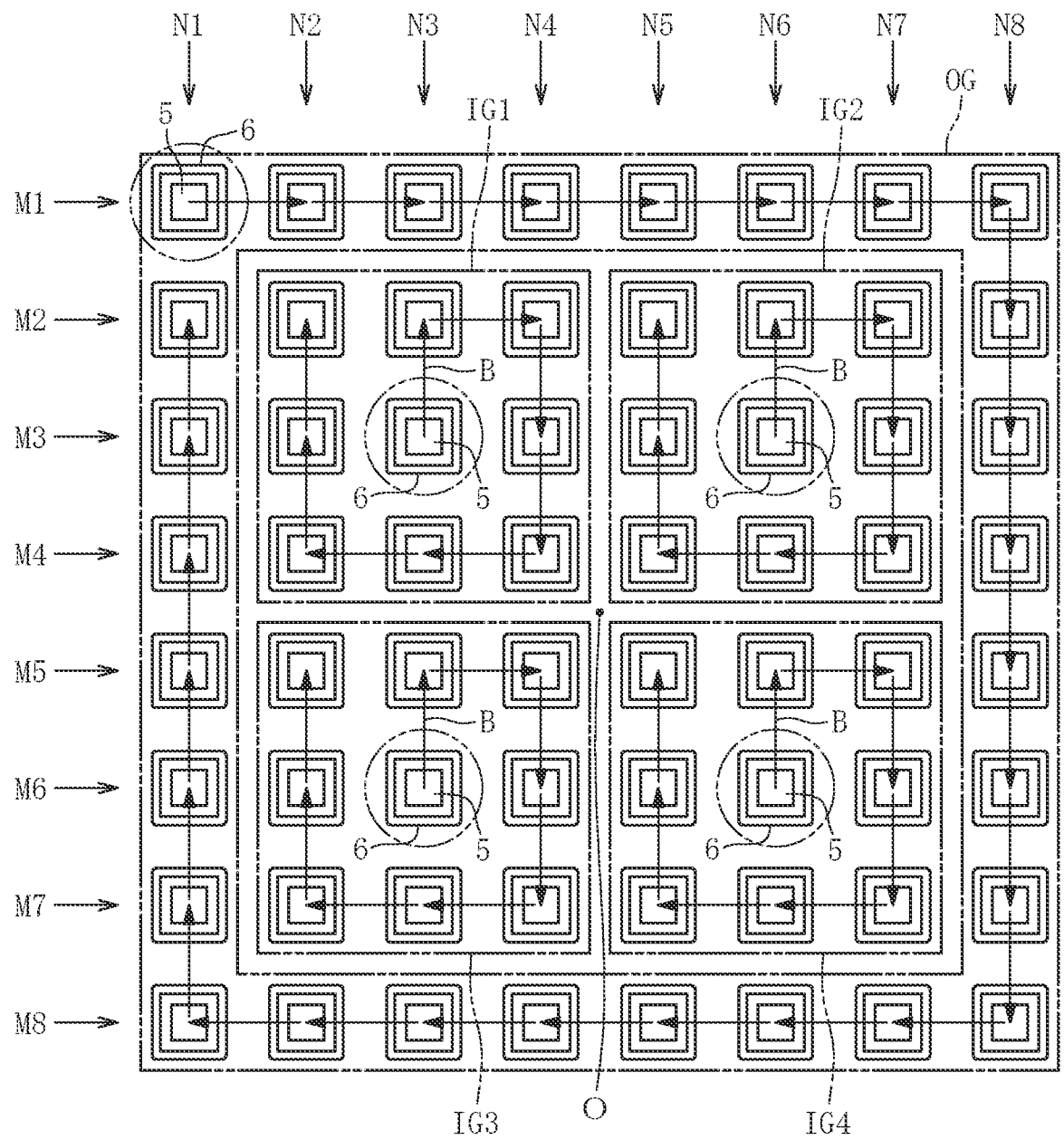
FIG. 10 is a plan view for illustrating another example of a method of producing a bonded body.

In the exemplary array pattern illustrated in FIG. 10 (matrix arrangement of eight rows and eight columns), the inner group is divided into the four groups (first inner group to fourth inner group) IG1 to IG4. The inner groups IG1 to IG4 are each configured to be symmetrical with respect to the center O of the array pattern. Each of the inner groups IG1 to IG4 includes nine sealing materials 6.

With this configuration, in the first bonding step, any one sealing material 6 belonging to any one of the inner groups IG1 to IG4 may be first irradiated with the laser beam L. Alternatively, sealing materials 6 belonging to the inner groups IG1 to IG4 may be irradiated simultaneously with laser beams L by using multiple laser irradiation devices 7.

Figure 11:
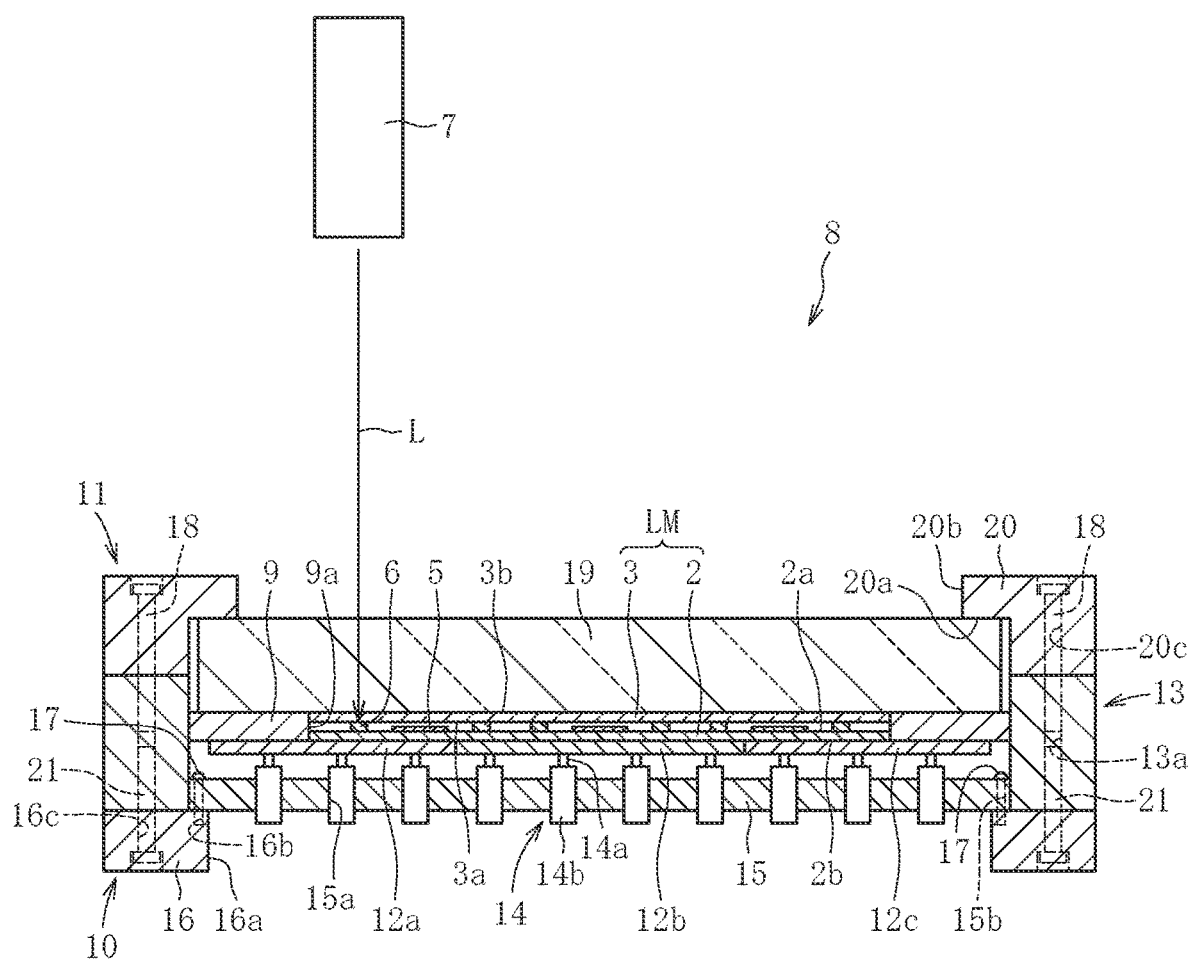
FIG. 11 is a cross-sectional view for illustrating another example of a support device used in the method of producing the bonded body.

In FIG. 11, there is illustrated another example of a support device. The support device 8 in this example differs from that illustrated in FIGS. 4 and 5 in the configuration of the support plate 12. The support device 8 illustrated in FIGS. 4 and 5 includes one support plate 12, but the support device 8 according to this embodiment includes multiple support plates 12a to 12c.

Pressing the first substrate 2 using the multiple support plates 12a to 12c, can reduce misalignment of the substrates 2 and 3 due to shrinkage of the sealing materials 6 during heating.

According to the methods of producing a bonded body 1 of the embodiments described above, irradiating the sealing materials 6 belonging to the inner groups IG (IG1 to IG4) with the laser beam L in the first bonding step before the sealing materials 6 belonging to the outer group OG can reduce misalignment of the substrates 2 and 3 due to shrinkage of the sealing materials 6 during the first bonding step.

Further, by irradiating the sealing materials 6 belonging to the outer group OG with the laser beam L in the second bonding step after the first bonding step, the sealing materials 6 belonging to the outer group OG can be heated without being affected by the shrinkage of the sealing layers 4 formed in the inner groups IG (IG1 to IG4). Thus, the occurrence of bonding defects can be reduced in both the sealing layers 4 belonging to the inner groups IG (IG1 to IG4) and the sealing layers 4 belonging to the outer group OG.

Note that the present invention is not limited to the configurations of the embodiments described above, and is not limited to the actions and effects described above. Various modifications can be made to the present invention without departing from the spirit of the present invention.

In the above embodiments, bonded bodies 1 including multiple sealing layers 4 arranged in three or more rows and three or more columns are used as examples, but the present invention is not limited to these configurations. The present invention can also be applied to a case where sealing layers 4 arranged in two rows and three or more columns are formed in the bonded body 1.

In this case, the bonded body 1 can be produced without bonding defects by assigning the sealing materials 6 located in the outermost columns to the outer group OG and assigning the sealing materials 6 located inward of the outer group OG to the inner group IG. Similarly, the present invention can also be applied to a case where sealing layers 4 arranged in three or more rows and two columns are formed in the bonded body 1.

In the above embodiments, the hermetically sealed package including the elements 5 is used as an example of the bonded body 1, but the present invention is not limited to this configuration. The present invention can be applied to, for example, producing a bonded body including a functional film or the like between the first substrate 2 and the second substrate 3, or a micro pump in which the second substrate 3 functions as a diaphragm.

In the above embodiments, a high-thermal-conductivity substrate is used as an example of the first substrate 2, but the present invention is not limited to this configuration. The first substrate 2 may be a glass substrate or another substrate.

EXAMPLES

An example according to the present invention will be described below, but the present invention is not limited to this example.

The inventor conducted tests to confirm the effect of the present invention. In these tests, multiple laminates (an example and a comparative example) were prepared with multiple sealing materials present between a first substrate and a second substrate, and the sealing materials were each heated by a laser beam to bond the first substrate and the second substrate to each other.

The first substrates used in the example and the comparative example were rectangular silicon substrates. The thickness of the first substrate was 0.4 mm. The second substrates used in the example and the comparative example were rectangular glass substrates made of borosilicate glass. The thickness of the second substrate was 0.2 mm.

The sealing material used in the example and the comparative example was a composite material (glass frit) containing bismuth-based glass powder and refractory filler powder. Note that the same sealing material was used in the example and the comparative example. Table 1 shows the composition and properties of the sealing material.

TABLE 1

| Sealing material | Glass powder | Bismuth-based glass composition (mol %) | $Bi_2O_3$ | 45 |
|---|---|---|---|---|
| | | | $B_2O_3$ | 25 |
| | | | ZnO | 15 |
| | | | CuO | 10 |

TABLE 1-continued

| | | MnO | 5 |
|---|---|---|---|
| | Bismuth-based glass powder (volume %) | | 75 |
| Refractory filler powder | β-quartz solid solution powder (volume %) | | 25 |
| | Median particle size $D_{50}$ (μm) | | 1.0 |
| | 99% particle size $D_{99}$ (μm) | | 1.6 |
| | Softening point (° C.) | | 445 |

The sealing material was formed on the second substrate as follows. First, the sealing material and a vehicle (composed of ethyl cellulose as resin and terpineol as a solvent) were mixed at a weight ratio of 60% to 40% and kneaded using a three-roller to form a paste. Subsequently, the second substrate was obtained by applying the paste in a quadrilateral closed curve shape for the example and the comparative example by a screen printing method. Note that the shape (width and thickness) of the paste applied on the second substrate was the same in both the example and the comparative example.

Subsequently, the second substrate to which the paste was applied was heated in an electric furnace at 480° C. for 20 minutes to form sealing materials in a quadrilateral closed curve shape on the glass substrate. A total of 81 sealing materials were formed on the second substrate according to each of the example and the comparative example in an array pattern of nine rows and nine columns. Subsequently, the second substrate on which the sealing materials were formed was placed on the first substrate at a predetermined position to form a laminate, and this laminate was set in the support device described above. Note that the shape (width and thickness) of the sealing materials formed on the second substrate was the same in both the example and the comparative example.

Subsequently, a laser beam being a near infrared semiconductor laser having a wavelength of 808 nm was circulated (scanned) twice along the circumferential direction of the sealing materials in the laminate supported by the support device to heat the sealing materials and form sealing layers, thereby bonding the first substrate and the second substrate to each other.

The order of irradiating the sealing materials according to the example with the laser beam was the same as in the example illustrated in FIG. 7.

Figure 12:
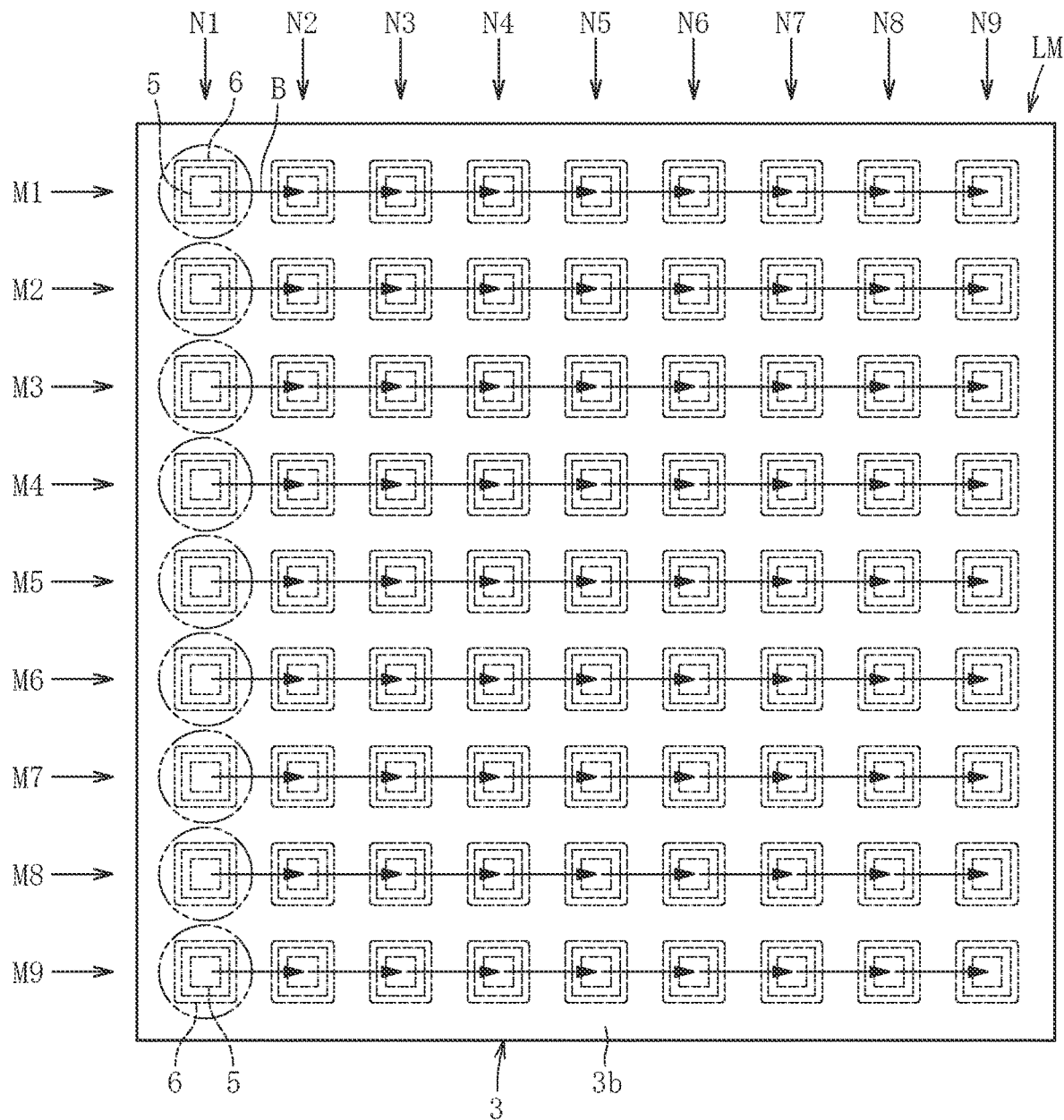
FIG. 12 is a plan view for illustrating a method of producing a bonded body according to a comparative example.

The sealing materials according to the comparative example were irradiated with the laser beam in the order indicated by the arrow B in FIG. 12. In other words, of the sealing materials 6 arranged in nine rows and nine columns in the laminate LM according to the comparative example, the sealing material 6 at the outermost position, that is, the position of the first row M1 and the first row N1, was first irradiated with the laser beam and heated. Subsequently, the sealing materials 6 arranged in the first row M1 were sequentially heated from the second column N2 to the ninth column N9. When the heating of the sealing materials 6 located in the first row M1 was complete, the sealing material 6 located in the second row M2 and the first column N1 was irradiated with the laser beam and heated. Subsequently, the sealing materials 6 located in the second row M2 were sequentially irradiated with the laser beam from the second column N2 to the ninth column N9. Similarly, the sealing materials 6 arranged in the third row M3 to the ninth row M9 were sequentially irradiated with the laser beam from the first column N1 to the ninth column N9. All the sealing materials 6 were heated to produce a bonded body according to the comparative example.

The hermetic reliability of the bonded bodies produced in the example and the comparative example were evaluated by a pressure cooker test (PCT) as an accelerated deterioration test. Specifically, the bonded bodies produced as described above were held for 24 hours in an environment at 121° C., 2 atm, and 100% relative humidity, and then the area around the sealing layers of the bonded bodies was observed using an optical microscope (100×). Based on this observation, the presence or absence of bonding defects due to the sealing layers were evaluated.

The results of the tests showed that no bonding defects were observed for all the sealing layers in the bonded body according to the example. On the other hand, approximately 30% of the sealing layers had bonding defects in the bonded body according to the comparative example.

REFERENCE SIGNS LIST

1 Bonded body
2 First substrate
3 Second substrate
4 Sealing layer
6 Sealing material
6a Sealing material located closest to center of array pattern
6j Sealing material located closest to center of array pattern
6k Sealing material located closest to center of array pattern
6l Sealing material located closest to center of array pattern
6m Sealing material located closest to center of array pattern
8 Support device
11 Support plate
IG Inner group
IG1 First inner group
IG2 Second inner group
IG3 Third inner group
IG4 Fourth inner group
L Laser beam
LM Laminate
O Center of array pattern
OG Outer Group

The invention claimed is:

1. A method of producing a bonded body including a first substrate, a second substrate, and multiple sealing layers bonding the first substrate and the second substrate, the method comprising:
a lamination step of forming a laminate by interposing multiple sealing materials between the first substrate and the second substrate and stacking the first substrate and the second substrate; and
a bonding step of forming the multiple sealing layers by irradiating the multiple sealing materials in the laminate with a laser beam, wherein the multiple sealing materials in the laminate are interposed between the first substrate and the second substrate in a predetermined array pattern,
wherein the array pattern comprises an outer group including a first set of the sealing materials, the first set of sealing materials being located on outermost sides among the multiple sealing materials, and
an inner group including a second set of the sealing materials, the second set of sealing materials being located inward of the first set of sealing materials belonging to the outer group,
wherein the inner group includes a first inner group, a second inner group and a third inner group,
wherein the first inner group includes a sealing material of the second set of sealing materials disposed overlapping a center of the array pattern,
wherein the second inner group includes other sealing materials of the second set of sealing materials disposed outward so as to surround the sealing material belonging to the first inner group,
wherein the third inner group includes further sealing materials of the second set of sealing materials disposed outward so as to surround the other sealing materials belonging to the second inner group,
wherein the bonding step comprises:
a first bonding step of forming a portion of the sealing layers by irradiating the second set of sealing materials belonging to the inner group with the laser beam; and
a second bonding step of forming a remainder of the sealing layers by irradiating the first set of sealing materials belonging to the outer group with the laser beam after the first bonding step, and
wherein, in the first bonding step, when irradiating the further sealing materials belonging to the third inner group with the laser beam, one of the further sealing materials of the third inner group that is positioned at a position being not adjacent to and being separated from one of the other sealing materials that has been finally irradiated with the laser beam in the second inner group is first irradiated with the laser beam.

2. A method of producing a bonded body including a first substrate, a second substrate, and multiple sealing layers bonding the first substrate and the second substrate, the method comprising:
a lamination step of forming a laminate by interposing multiple sealing materials between the first substrate and the second substrate and stacking the first substrate and the second substrate; and
a bonding step of forming the multiple sealing layers by irradiating the multiple sealing materials in the laminate, wherein the multiple sealing materials in the laminate are interposed between the first substrate and the second substrate in a predetermined array pattern,
wherein the array pattern comprises an outer group including a first set of the sealing materials, the first set of sealing materials being located on outermost sides among the multiple sealing materials, and an inner group including a second set of the sealing materials, the second set of sealing materials being located inward of the first set of sealing materials belonging to the outer group,
wherein the inner group includes a first inner group, a second inner group, a third inner group and a fourth group, and
wherein the bonding step comprises:
a first bonding step of forming a portion of the sealing layers by simultaneously irradiating the second set of sealing materials belonging to the first inner group, the second inner group, the third inner group and the fourth inner group of the inner group with laser beams by using multiple laser irradiation devices; and
a second bonding step of forming a remainder of the sealing layers by irradiating the first set of sealing materials belonging to the outer group with a laser beam after the first bonding step.

3. The method of producing a bonded body according to claim 1, wherein in the array pattern, the multiple sealing materials are arranged in three or more rows and three or more columns.

4. The method of producing a bonded body according to claim 1, wherein the second substrate is a glass substrate.

5. The method of producing a bonded body according to claim 1,
- wherein, in the bonding step, the laminate is supported by a support device configured to press the first substrate and the second substrate,
- wherein the support device comprises multiple pressing members configured to press the first substrate against the second substrate, and one support plate disposed between the first substrate and the multiple pressing members, and
- wherein the one support plate presses the first substrate against the second substrate by pressing the one support plate by the multiple pressing members.

6. A method of producing a bonded body including a first substrate, a second substrate, and multiple sealing layers bonding the first substrate and the second substrate, the method comprising:
- a lamination step of forming a laminate by interposing multiple sealing materials between the first substrate and the second substrate and stacking the first substrate and the second substrate; and
- a bonding step of forming the multiple sealing layers by irradiating the multiple sealing materials in the laminate with a laser beam, wherein the multiple sealing materials in the laminate are interposed between the first substrate and the second substrate in a predetermined array pattern,
- wherein the array pattern comprises an outer group including a set of the sealing materials, the set of sealing materials being located on outermost sides among the multiple sealing materials, and an inner group including a sealing material of the sealing materials, the inner group being located inward of the set of sealing materials belonging to the outer group,
- wherein the bonding step comprises:
  - a first bonding step of forming a portion of the sealing layers by irradiating the sealing material belonging to the inner group with the laser beam; and
  - a second bonding step of forming a remainder of the sealing layers by irradiating the set of sealing materials belonging to the outer group with the laser beam after the first bonding step,
- wherein, in the bonding step, the laminate body is supported by a support device configured to press the first substrate and the second substrate,
- wherein the support device includes multiple pressing members configured to press the first substrate to the second substrate, and one support plate disposed between the first substrate and the multiple pressing members, and
- wherein the one support plate presses the first substrate against the second substrate by pressing the one support plate by the multiple pressing members.

* * * * *